(12) United States Patent
Vora

(10) Patent No.: US 7,557,393 B2
(45) Date of Patent: Jul. 7, 2009

(54) JFET WITH BUILT IN BACK GATE IN EITHER SOI OR BULK SILICON

(75) Inventor: Madhukar B. Vora, Los Gatos, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 171 days.

(21) Appl. No.: 11/502,172

(22) Filed: Aug. 10, 2006

(65) Prior Publication Data

US 2008/0036009 A1 Feb. 14, 2008

(51) Int. Cl.
*H01L 31/112* (2006.01)
(52) U.S. Cl. ........................... 257/261; 257/270
(58) Field of Classification Search ............... 257/371, 257/261, 270
See application file for complete search history.

(56) References Cited

U.S. PATENT DOCUMENTS

| | | | | |
|---|---|---|---|---|
| 3,755,012 | A | 8/1973 | George et al. | 148/175 |
| 5,652,153 | A | 7/1997 | Beasom | 437/29 |
| 2004/0129959 | A1 | 7/2004 | Kim et al. | 257/288 |
| 2006/0056228 | A1 | 3/2006 | Schloesser et al. | 365/149 |
| 2007/0284628 | A1* | 12/2007 | Kapoor | 257/270 |

FOREIGN PATENT DOCUMENTS

| | | |
|---|---|---|
| EP | 0 462 882 A1 | 12/1991 |
| EP | 0 729 188 A2 | 8/1996 |
| GB | 2 066 571 A | 7/1981 |
| WO | WO 2006/042669 A1 | 4/2006 |

OTHER PUBLICATIONS

*Notification of Transmittal of the International Search Report and the Written Opinion of the International Searching Authority* for International Application No. PCT/US2007/075535; 15 pages.
Patent Pending U.S. Appl. No. 12/270,964 entitled *JFET With Built In Back Gate in Either SOI or Bulk Silicon* in the name of Madhukar B. Vora; 44 total pages.

* cited by examiner

*Primary Examiner*—Thao X Le
*Assistant Examiner*—Tanika Warrior
(74) *Attorney, Agent, or Firm*—Baker Botts L.L.P.

(57) ABSTRACT

A Junction Field-Effect transistor with no surface contact for the back gate and twice as much transconductance in the channel and with a higher switching speed is achieved by intentionally shorting the channel-well PN junction with the gate region. This is achieved by intentionally etching away field oxide outside the active area at least in the gate region so as to expose the sidewalls of the active area down to the channel-well PN junction or a buried gate which is in electrical contact with the well. Polysilicon is then deposited in the trench and doped heavily and an anneal step is used to drive impurities into the top and sidewalls of the channel region thereby creating a "wrap-around" gate region which reaches down the sidewalls of the channel region to the channel-well PN junction. This causes the bias applied to the gate terminal to also be applied to the well thereby modulating the channel transconductance with the depletion regions around both the gate-channel PN junction and the channel-well PN junction.

23 Claims, 13 Drawing Sheets

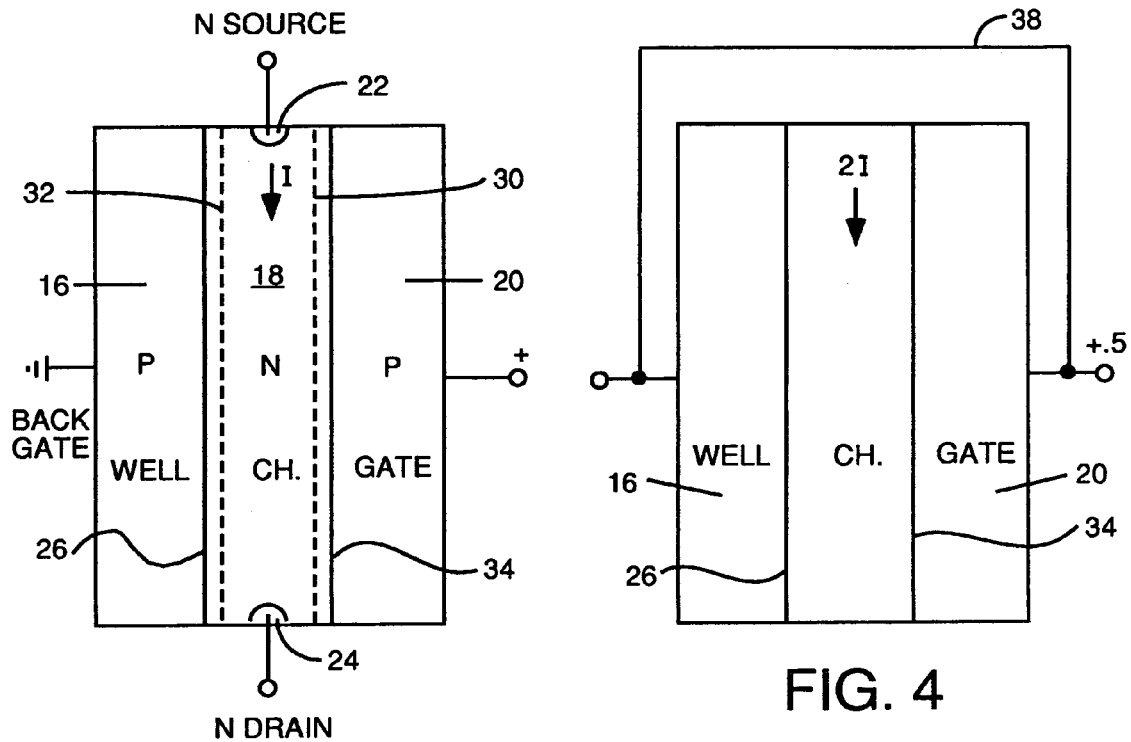

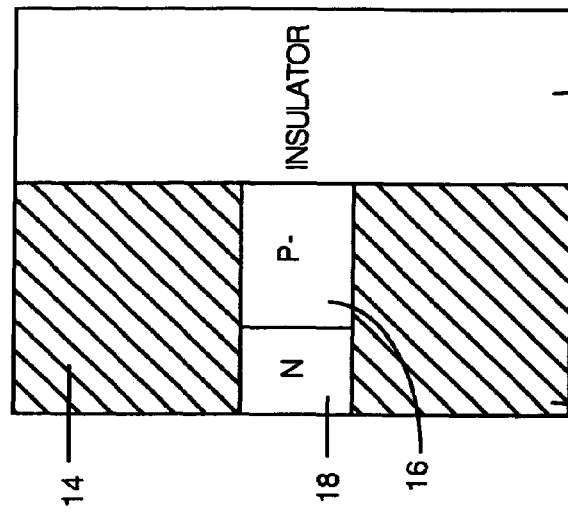
FIG. 6B
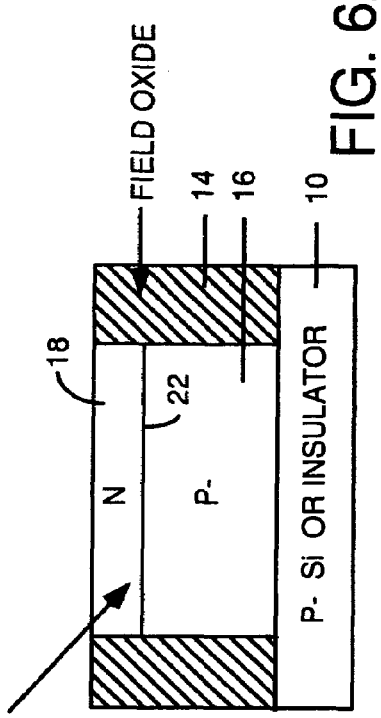
FIG. 6A
FIG. 6D
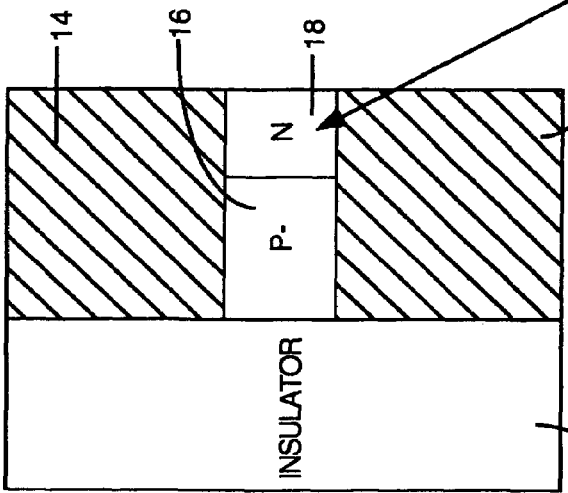
FIG. 6C

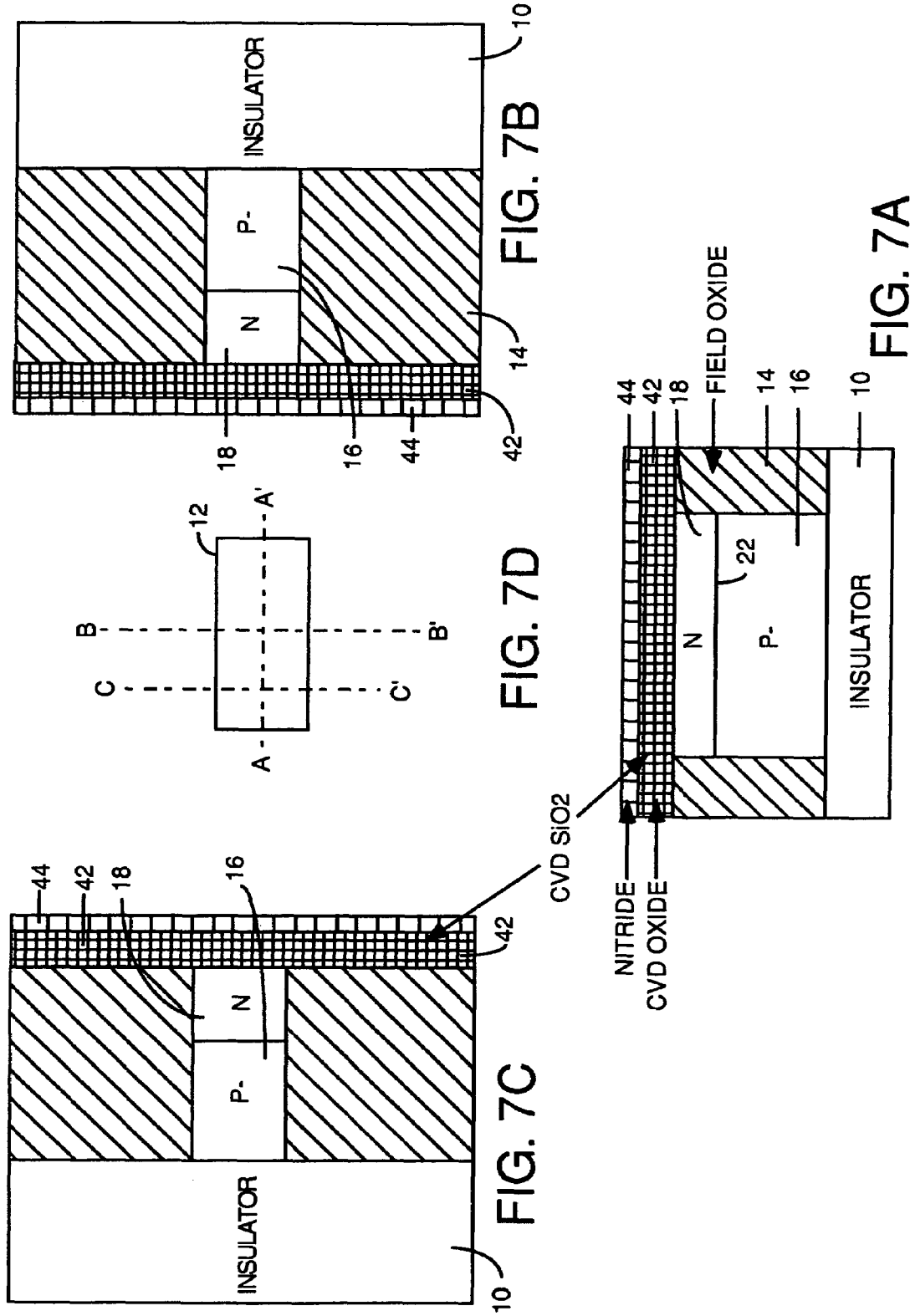

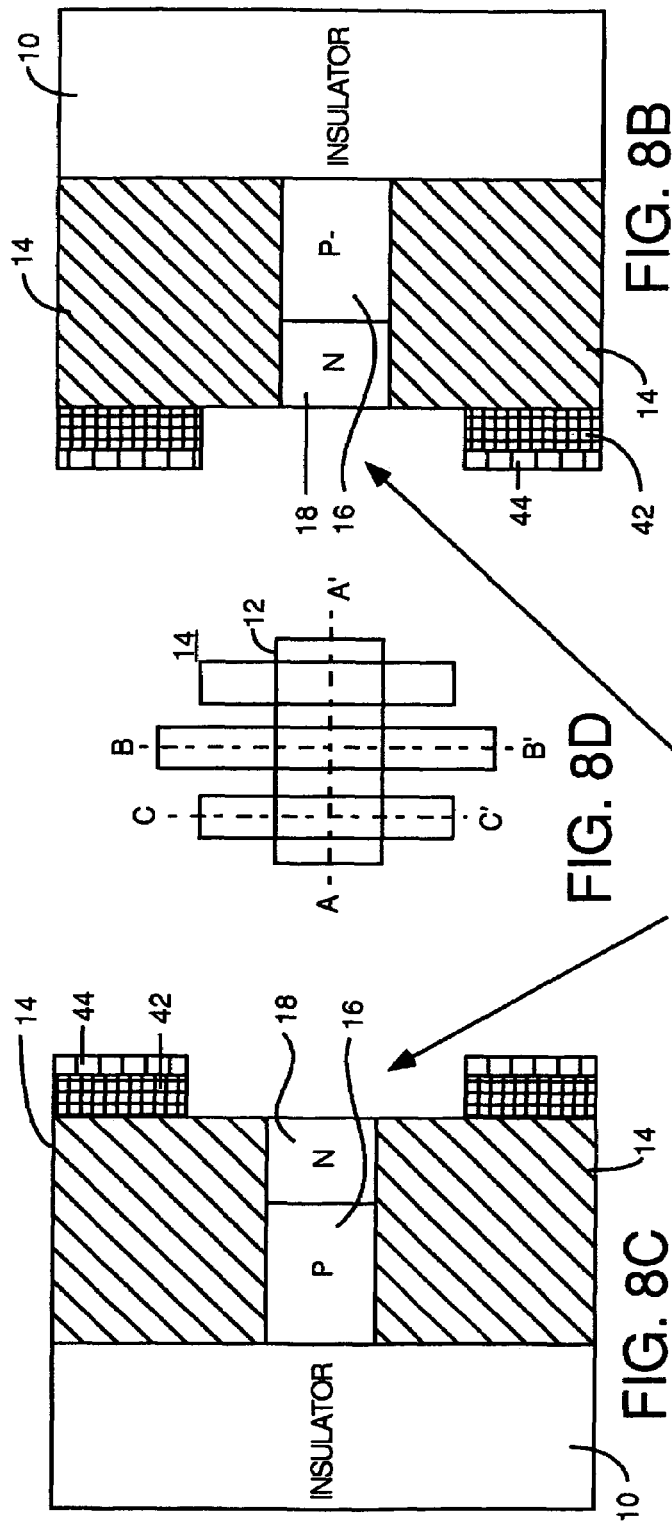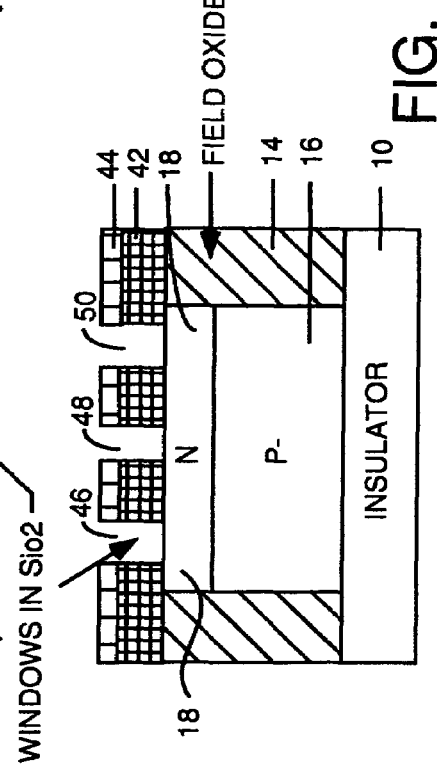

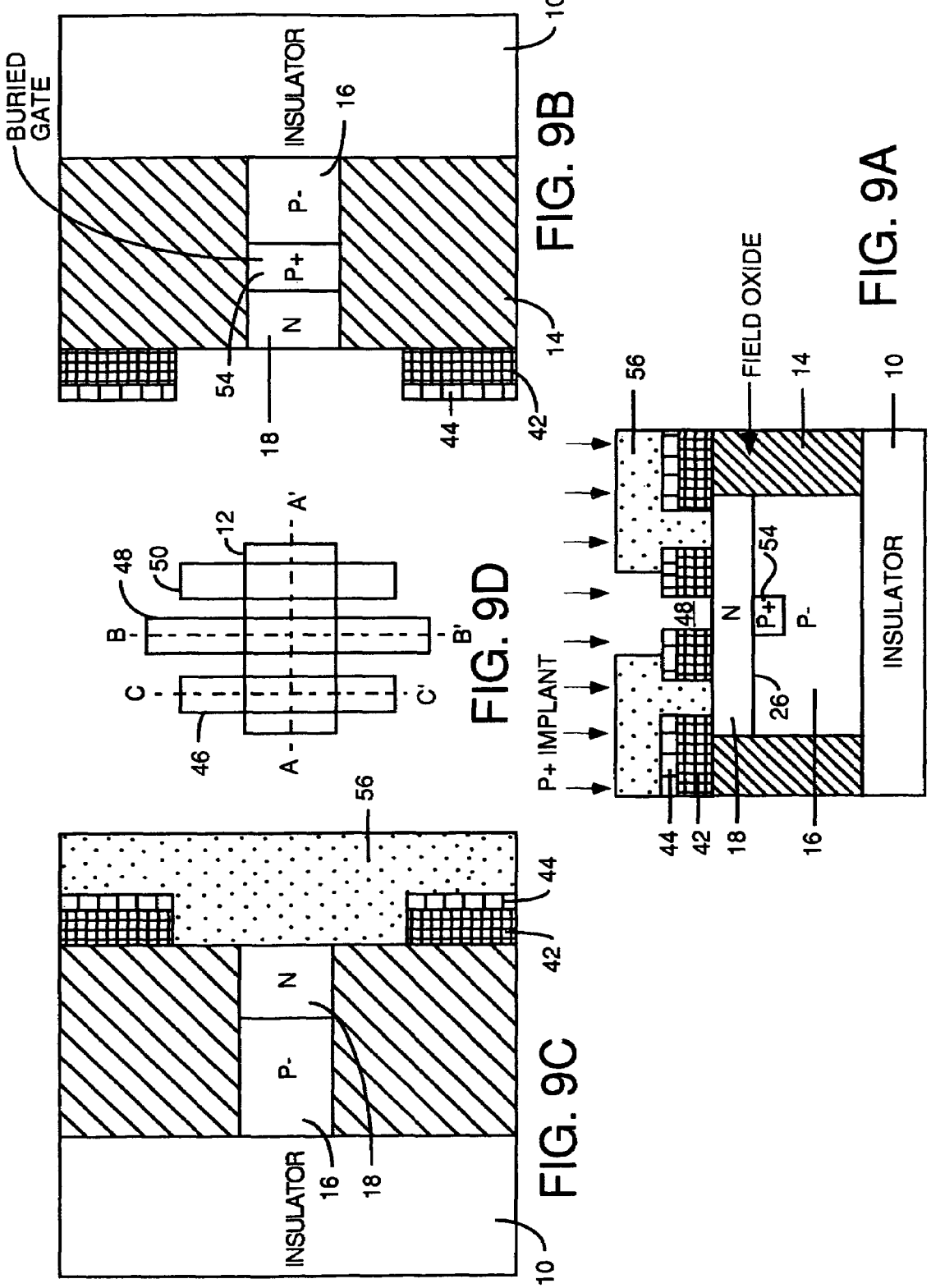

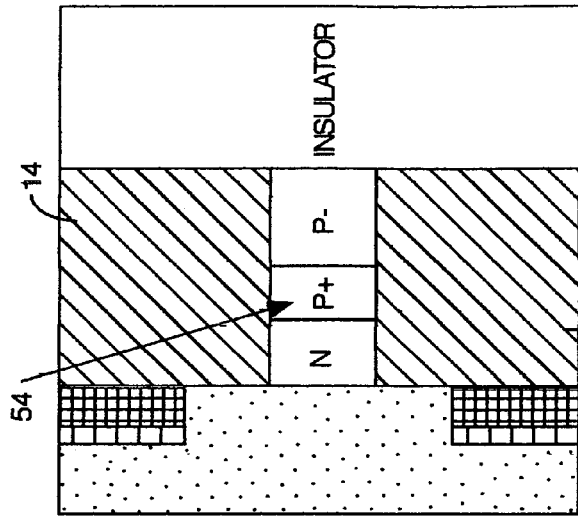
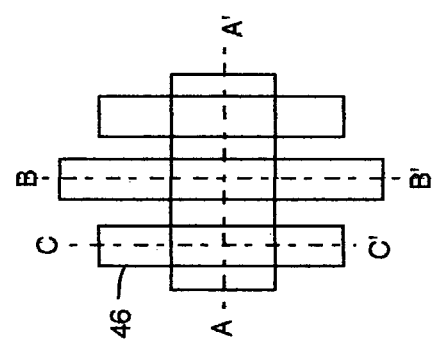
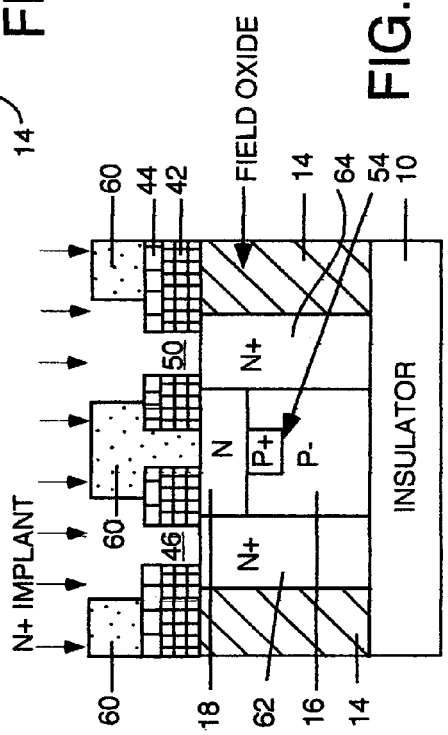
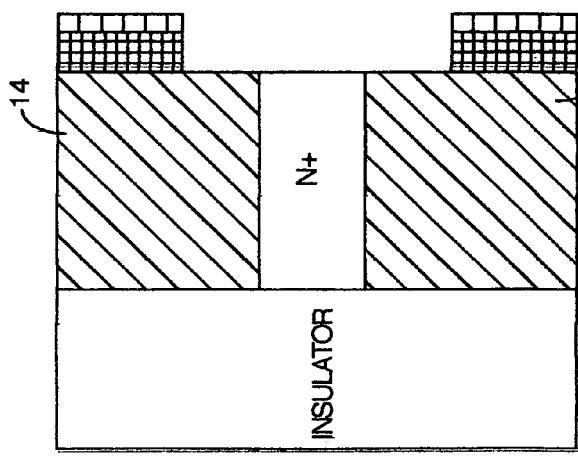
FIG. 10B
FIG. 10A
FIG. 10D
FIG. 10C

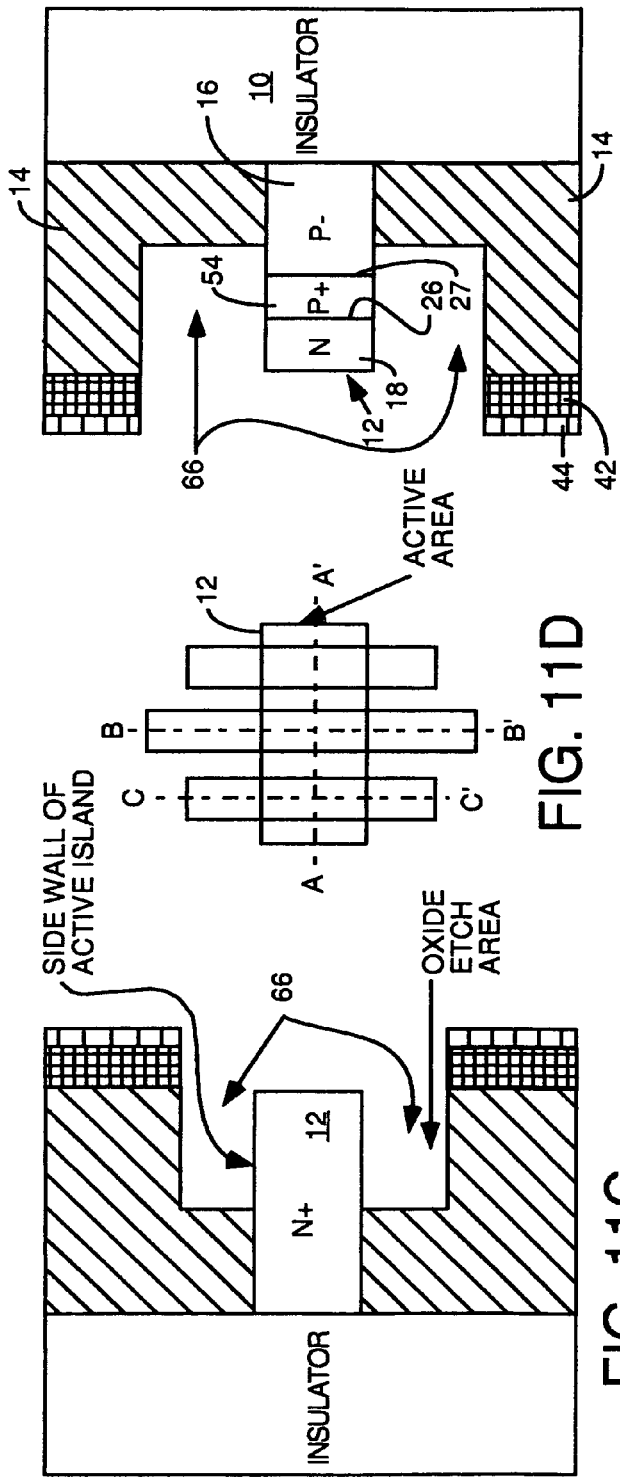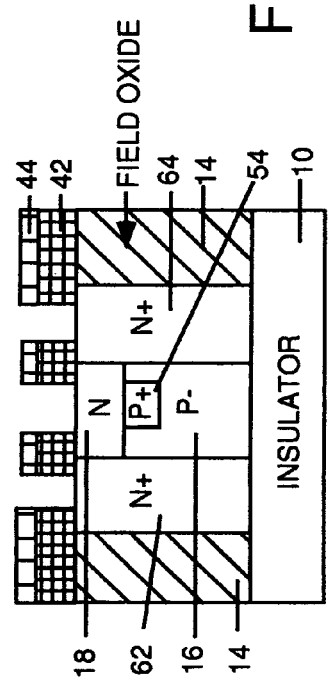
FIG. 11A
FIG. 11B
FIG. 11C
FIG. 11D

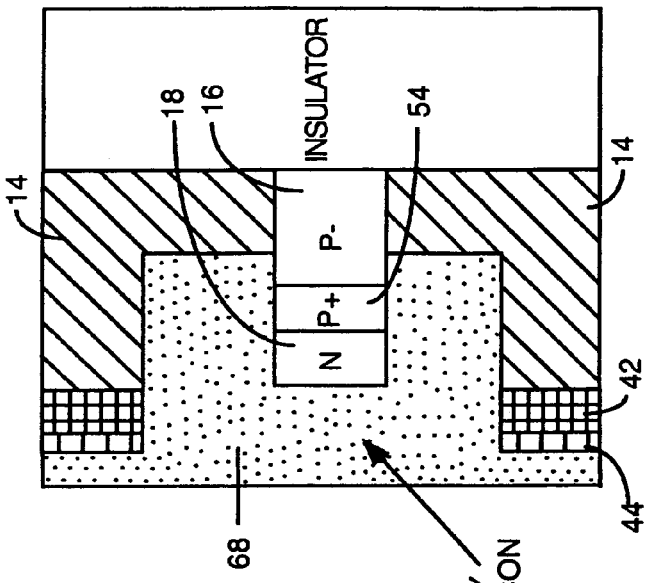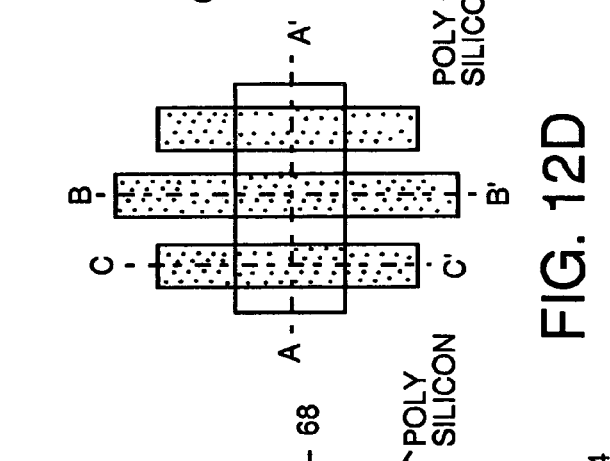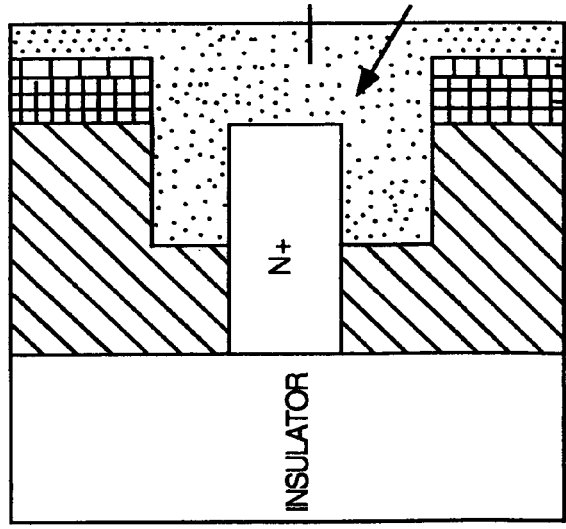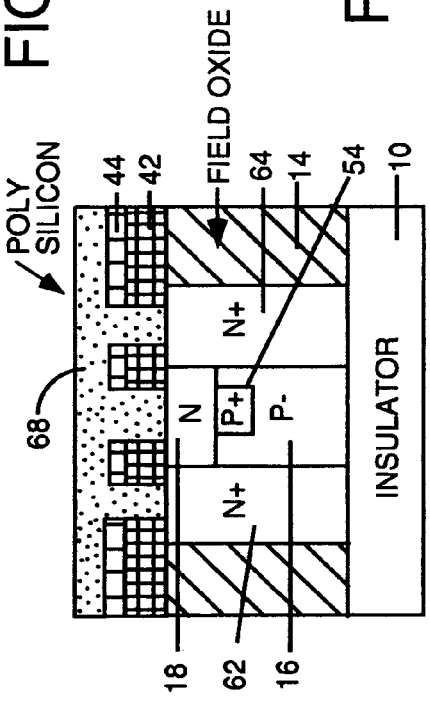
FIG. 12B
FIG. 12A
FIG. 12D
FIG. 12C

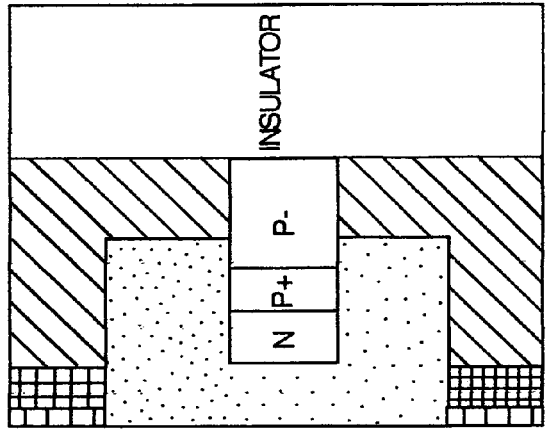
FIG. 13B
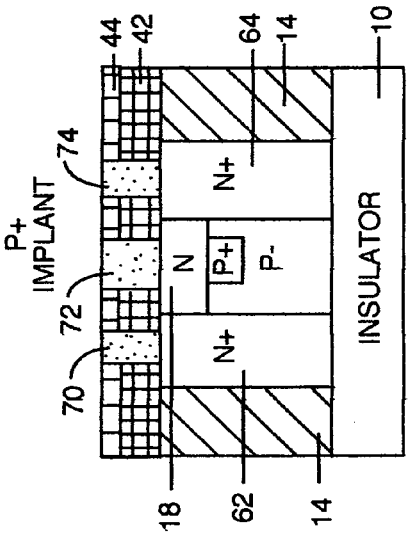
FIG. 13A
FIG. 13D
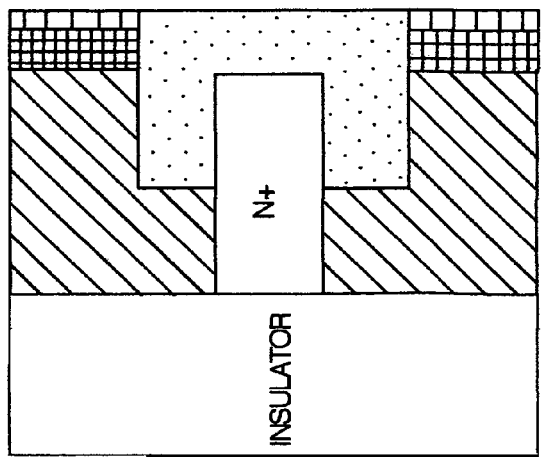
FIG. 13C

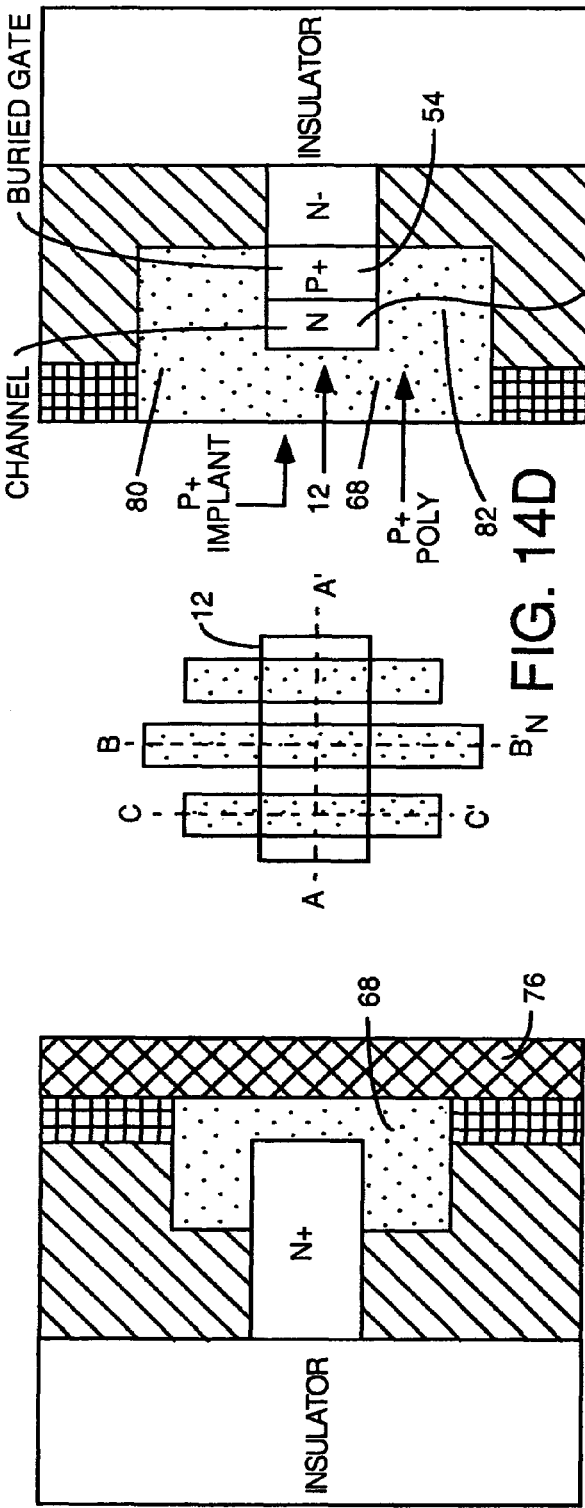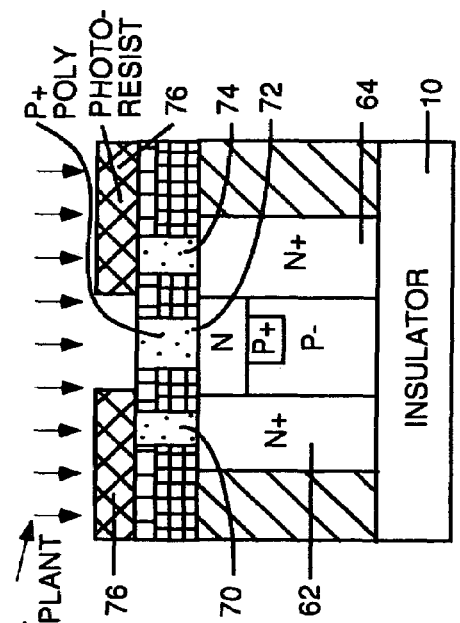
FIG. 14A
FIG. 14B
FIG. 14C
FIG. 14D

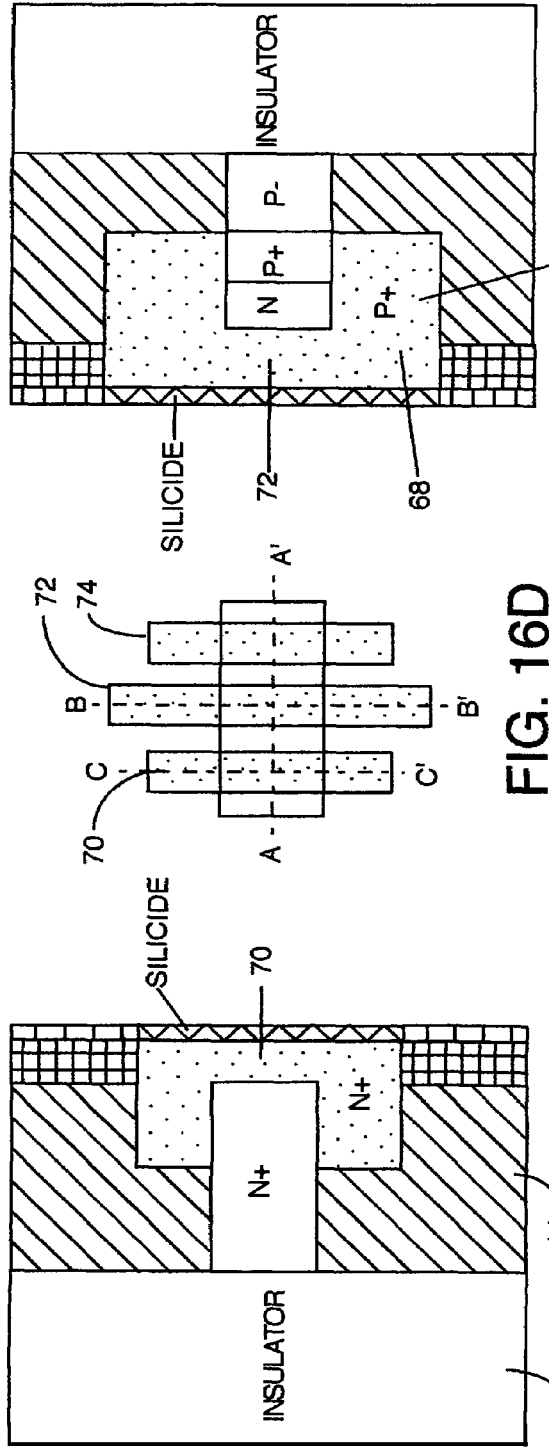

JFET WITH BUILT IN BACK GATE IN EITHER SOI OR BULK SILICON

FIELD OF USE AND BACKGROUND OF THE INVENTION

Junction Field-Effect Transistors (JFETs) are made in active areas in semiconductor substrates where the active area is surrounded by field oxide. In the active area, a conductive area called a well is formed and that well forms a PN junction with the bulk substrate. That PN junction is called the back gate, and it is conventional to form a surface contact to the well so that bias can be applied to the well region for various purposes. This separate contact for the well consumes chip area and reduces the overall total number of devices that can be formed on any wafer.

In the well, a conductive channel region is formed, and in that channel region, conductive source, drain and gate regions are formed. These source, drain and gate regions form PN junctions with the channel region. In a new class of processes and structures which are the subject of patent applications previously filed by the assignee of the present invention, these source, drain and gate regions are very shallow. Each of the source, drain and gate regions has a surface contact.

The JFET functions to selectively switch current flow between the source and drain contacts. This is done by applying suitable voltages to the source and drain and applying a bias voltage to the gate contact which is such as to cause pinchoff when no current flow is desired and to open the channel when current flow is desired. Pinchoff is a condition where depletion regions from the gate-channel junction and the channel substrate junction meet and block current flow for lack of minority carriers in the channel. In an n-channel enhancement-mode JFET, current flows when the gate is biased to a positive voltage which is sufficient to cause the depletion regions to not meet, thereby opening the channel for conduction. Pinchoff is achieved by holding the gate at ground or a negative voltage. Depletion-mode devices are also available which are normally conductive when a source-to-drain bias is applied and the gate voltage is below the pinchoff voltage. In these devices, the gate must be driven to a voltage adequate to cause pinchoff to cut off current flow.

All these devices require proper operation of the shallow PN gate-channel junction to operate as designed. If this junction is shorted, the device does not operate as a normal four terminal JFET.

In making JFETS, a class of processes exist in which a layer of silicon dioxide is deposited over the entire structure including the active area. Openings are etched in this oxide layer where the source, drain and gate and back gate surface contacts are to be formed. This layer is thin however, and the openings are etched with a process that can over-etch and eat away the field oxide at the edge of the active area so as to expose the sidewall of the active area. If the over etching is bad enough, the gate-channel, source-channel and drain-channel PN junctions can be exposed. Then when conductive polycrystalline silicon (hereafter polysilicon) or metal is deposited into the openings to form the surface contacts, the gate-channel, source-channel and drain-channel PN junctions can be shorted. This can render the device inoperative, but it can also be used to advantage to eliminate the surface contact for the back gate.

SUMMARY OF THE INVENTION

The teachings of the invention contemplate intentionally over-etching the field oxide outside the active area when etching the opening for the gate surface contact to expose the channel-well PN junction and then depositing P+ polysilicon into the opening. The P+ polysilicon fills the opening and spills over into the notch outside the active area as shown in FIG. 1. Conductivity-enhancing impurities from the P+ polysilicon are driven by diffusion into the channel region to form the P+ gate region. Because of the over-etching, the P+ gate region extends down the exposed side walls of the channel region and meets the channel-well PN junction. This shorts the channel-well PN junction and eliminates the need for the surface contact to the well. In the device so formed, the well will always have the same bias voltage as the gate because of this gate region which extends far enough to contact the channel-well junction and shorts it. This turns the normal four terminal JFET into a three terminal device.

With a JFET structured as taught herein, the well will always have the same bias as the gate region because the gate region extends down the sidewalls of the channel region where the gate polysilicon crosses over the active area and dips down into the notch etched in the field oxide. This causes the channel-well PN junction to be shorted thereby causing the well to have the same bias as the gate. Thus, when the gate-channel PN junction is forward biased, so is the channel-well PN junction. In an enhancement-mode device, this means that the depletion regions around these two PN junctions decrease in size thereby opening up a conductive path through the channel. Generally, about twice as much current flows through this channel in a device according to the teachings of the invention as in a normal four terminal enhancement-mode JFET where the gate-channel junction is forward biased and the well is grounded. When the well is grounded, there is no effect on the channel-well PN junction and its depletion region extends into the channel region thereby depleting a portion of the channel region of minority carriers. This portion of the volume of the channel cannot conduct current between the source and drain. In a three terminal device as taught herein, when the gate-channel junction is forward biased, so is the channel-well junction. This means that the volume of the channel region which is normally consumed by the depletion region around the channel-well junction in a four terminal device is not consumed by depletion region in the three terminal device and is available for conduction. Therefore, approximately twice the source-drain current flows in the three terminal enhancement JFET when the gate is biased to a level sufficient to bring the device out of pinch-off, and the transconductance (the change in source to drain current divided by the change in gate voltage that caused said change in source to drain current) is doubled. In an alternative embodiment, the material under the semiconductor well can be an insulator. In these embodiments, one starts with an insulating substrate and forms a semiconductor region above it by means of epitaxial growth. This semiconductor region will be doped to form the well, and field oxide will be formed to define a portion of the well as an active area. Thereafter, processing to form a structure according to the teachings of the invention is as described elsewhere herein. By virtue of elimination of the well-substrate PN junction, the parasitic capacitance of that junction is eliminated. This makes the device faster.

The invention enables elimination of the area consumed by the back gate contact and all the design rule tolerances around it as well as parasitic capacitances associated with the back gate. By virtue of elimination of the back gate contact parasitic capacitances, a structure according to the teachings of the invention has a faster switching speed than four terminal JFETs. This is because the structure is such as to eliminate the parasitic junction capacitance associated with the P+ back gate contact interface with the P– well. Further, the structure of the preferred embodiment built on an insulating substrate also eliminates the parasitic junction capacitance of the junction between the P– well and the underlying N-doped bulk substrate thereby speeding up the maximum switching speed of the device.

BRIEF DESCRIPTION OF THE DRAWINGS

FIG. 3 is a symbolic schematic drawing of the conventional JFET showing how the gate and well are biased in a typical depletion-mode device to cause current flow from source to drain through the channel.

FIG. 4 illustrates the effect of the use of the structure of the invention on the voltage conditions of the gate and well regions.

FIG. 5 is a table which illustrates the various source-to-drain current flow operating conditions and front gate biases that cause them in a three-terminal, enhancement-mode JFET device of the invention.

FIG. 6, comprised of FIGS. 6A, 6B, 6C and 6D and shows the results of process steps 1-4 in Appendix A. FIG. 6D is a top view of the active area. FIG. 6A is a sectional view taken along section line AA' in FIG. 6D. FIG. 6B is a sectional view taken along section line BB' in FIG. 6D. FIG. 6C is a sectional view taken along section line CC' in FIG. 6C.

FIG. 7, comprised of FIGS. 7A, B, 7C and 7D, shows the state of the structure after step 5 in the process has been performed to deposit CVD oxide and a layer of nitride and polish it back. FIGS. 7A, 7B, 7C are sectional views of the structure taken along section lines AA', BB' and CC', respectively, in the plan view of FIG. 7D.

FIG. 8, comprised of FIGS. 8A, 8B, 8C and 8D, shows the state of the structure after step 6 in the process has been performed to open windows for the gate, source and drain contacts. FIGS. 8A, 8B, 8C are sectional views of the structure taken along section lines AA', BB' and CC', respectively, in the plan view of FIG. 8D.

FIG. 9, comprised of FIGS. 9A, 9B, 9C and 9D, shows the state of the structure after step 7 in the process has been performed to mask and implant to form a buried gate. FIGS. 9A, 9B, 9C are sectional views of the structure taken along section lines AA', BB' and CC', respectively, in the plan view of FIG. 9D.

FIG. 10, comprised of FIGS. 10A, 10B, 10C and 10D, shows the state of the structure after steps 9 and 10 in the process have been performed to mask and implant to form N+ source and drain regions. FIGS. 10A, 10B, 10C are sectional views of the structure taken along section lines AA', BB' and CC', respectively, in the plan view of FIG. 10D.

FIG. 11, comprised of FIGS. 11A, 11B, 11C and 11D, shows the state of the structure after step 11 in the process has been performed to selectively etch the field oxide to expose the side walls of the active area single crystal silicon.

FIG. 12, comprised of FIGS. 12A, 12B, 12C and 12D, shows the state of the structure after step 12 in the process has been performed to deposit undoped polysilicon over the entire structure.

FIG. 13, comprised of FIGS. 13A, 13B, 13C and 13D, shows the state of the structure after step 13 in the process has been performed to polish off the excess polysilicon and define separate source, drain and gate contacts.

FIG. 14, comprised of FIGS. 14A, 14B, 14C and 14D, shows the state of the structure after step 14 in the process has been performed to spin on photoresist, mask it and develop it to expose the gate contact polysilicon.

FIG. 16, comprised of FIGS. 16A, 16B, 16C and 16D, shows the state of the structure after step 16 in the process has been performed to complete the device.

DETAILED DESCRIPTION OF THE PREFERRED AND ALTERNATIVE EMBODIMENTS

Figure 1:
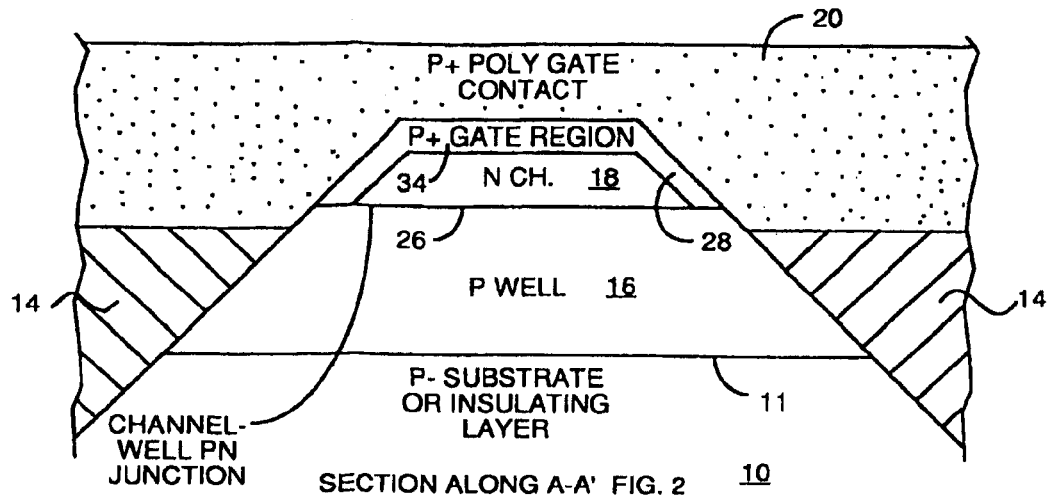
FIG. 1 is a cross-sectional view through a JFET built according to the teachings of the invention taken along section line A-A' in FIG. 2 through the gate polysilicon and down through the gate region, channel, P-well and substrate in an N-channel device.
Figure 2:
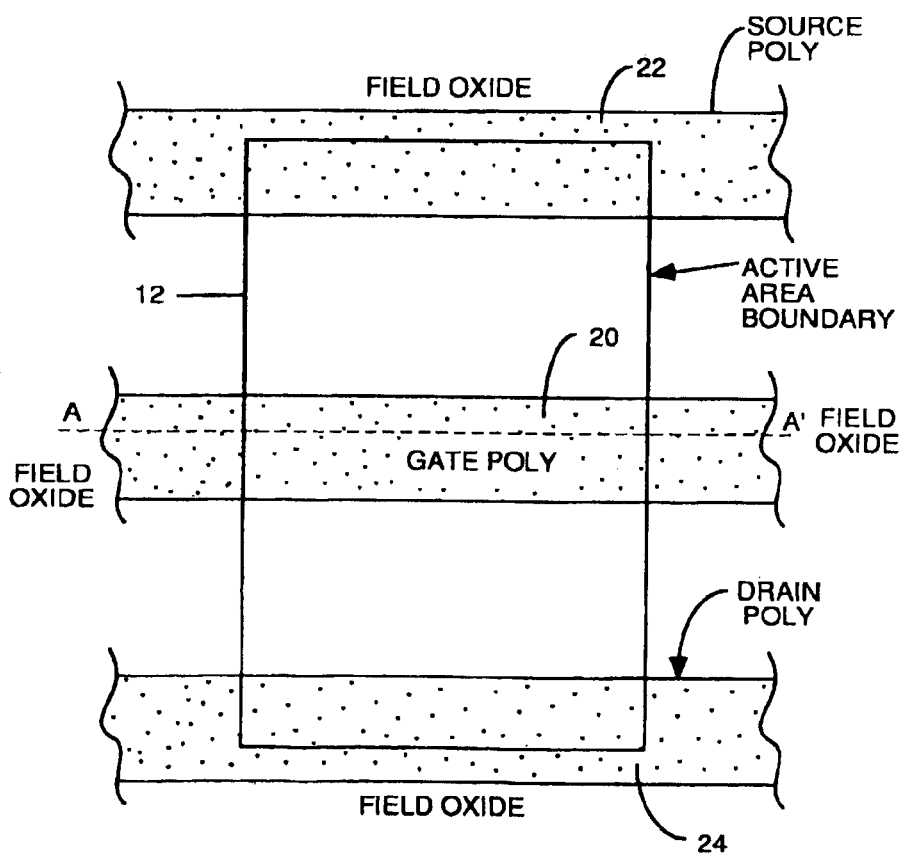
FIG. 2 is a top or plan view of the active area showing the active area boundary surrounded by field oxide and showing how the gate, source and drain polysilicon regions extend across the active area.

FIG. 1 is a cross-sectional view through a JFET built according to the teachings of the invention taken along section line A-A' in FIG. 2 through the gate polysilicon 20 and down through the gate region 28, channel region 18, P-well 16 and substrate 10 in an N-channel device. The substrate 10 is preferably insulating material such as sapphire, but it can also be P-doped silicon. In some embodiments, the substrate 10 can be <100> N-doped silicon. The substrate 10 will hereafter be referred to mainly as just the substrate regardless of its material. It is only necessary to have the well 16 and channel and gate regions, 18 and 28, respectively, be semiconductor. Having the substrate made of insulator is actually preferred since it eliminates the PN junction at the well-substrate interface thereby eliminating the parasitic capacitance associated therewith and making the device faster.

Although the substrate may be referred to as semiconductor in subsequent passages, those skilled in the art should understand this to include insulating material as the substrate below the well. Further, although an N-channel device is shown, the teachings of the invention also apply to P-channel devices, and the teachings of the invention are equally applicable to both enhancement-mode and depletion-mode devices.

The N-doped substrate 10 provides the semiconductor material in which the device will be formed. An active area 12 (see FIG. 2) is defined in this substrate by a region of field oxide 14 which surrounds the active area. This is typically shallow trench isolation. In this substrate, a P-doped well 16 (FIG. 1) is formed. Normally in a conventional JFET, this well would have a surface contact so that the P-well can be biased to whatever voltage is needed. With the present invention, this surface contact is not needed. Further description of FIG. 1 will be completed after a brief discussion of FIG. 2 so that the notching of the field oxide idea can be better understood.

FIG. 2 is a top or plan view of the active area showing the active area boundary 12 surrounded by field oxide 14 and showing how the gate, source and drain polysilicon regions extend across the active area. Polysilicon area 20 represents the gate contact. The section line A-A' through this gate polysilicon is the section line defining the structure seen in FIG. 1. The gate polysilicon 20 extends past the active area boundary since it is also used as an interconnect to connect the gate contact to other terminals in the circuit. That fact is part of the problem. Because the gate polysilicon extends past the boundary of the active area, to etch an opening which is to be filled with polysilicon to form the gate contact and interconnect requires etching down through a silicon dioxide film which is deposited on the surface of the substrate. The problem is that when the etchant reaches the surface of the substrate outside the active area, it encounters more silicon dioxide and it does not automatically stop. This problem is handled in other inventions belonging to the assignee of this invention by depositing a layer of silicon nitride all over the substrate first before depositing the silicon dioxide film. The silicon nitride acts as an etch stop. Absent the use of the silicon nitride film, over etching in JFET structures not using the invention is prevented by timing of the etching time so as to stop at the surface of the substrate. Since the etch rate is not precisely predictable and the films being etched are extremely thin, overetching is hard to avoid. The invention eliminates this problem.

The source polysilicon contact 22 and the drain polysilicon contact 24 also extend past the boundary of the active area. To prevent shorts of the source and drain to channel junctions, various precautions are taken depending upon the type of substrate. In the case of an insulator substrate, the N+ Source and drain implants are carried out at sufficient energies to make the source and drain regions extend from to the surface of the active area all the way to insulating substrate as shown in FIGS. 10A and 10B, In the case of a semiconductor N− substrate, the source and drain implants are carried out at sufficient energies such that the N+/P− source-channel junction (for both the source and drain junctions) is below the P+ back gate but above P−/N− well-substrate junction and so there will N+/P−/N− layers below S/S N+ Poly (layer 46 and 50 in FIG. 10A. Thus, the N+/P− source or drain to channel junction will be deep enough so as to not be shorted when the intentional short is formed by the "wrap around" gate region.

Returning to FIG. 1, when the opening for the gate contact and interconnect is formed, no nitride etch stop layer is used and the etching is allowed to proceed down into the field oxide far enough so as to expose or at least be even with the channel-well PN junction 26. This is important, because without this, the objective of the invention of shorting the channel-well PN junction 26 with the gate region cannot be achieved. To accomplish this, after the etching of the field oxide down to or past PN junction 26 is achieved, P+-doped polysilicon 20 that forms the gate contact and the gate interconnect is deposited in the opening etched for it. A diffusion step is then performed to drive impurities from the P+ polysilicon into the N-doped channel 18 at all surfaces with which the P+ polysilicon 20 is in contact. This diffusion step forms a gate region along the exposed surfaces of the channel region 18 all the way down to the P-well 16 thereby shorting the PN junction 26. This will cause the P-well 16 to always have the same bias as the gate region 28. This eliminates the need for a separate surface contact to the P-well 16 and saves the size of that surface contact and the chip area consumed by the design rule tolerances around the surface opening for this P-well contact. This reduces the number of terminals of the resulting JFET from four to three.

FIG. 3 is a symbolic schematic drawing of the prior art JFET which does not use the teachings of the invention. The figure shows how the gate and well are biased in a typical enhancement-mode device to cause current flow from source to drain through the channel. The channel region 18 is the region through which current I flows. In an enhancement-mode device, this current flows when gate region 20 is biased to a positive voltage relative to the source 22 by about 0.5 volts or less. The P-well 16 is grounded or driven to a positive voltage relative to the source. This voltage condition of the gate and well causes the depletion regions around junctions 26 and 34 to retract in an enhancement-mode device thereby removing the device from pinchoff and opening a conductive channel between the source 22 and drain 24 through which current I flows. This is the ON state for the enhancement-mode JFET. When the gate 20 and the P-well are grounded in this enhancement-mode device, channel 18 is pinched off. In other words, the edges 30 and 32 of depletion regions of junctions 26 and 34 are touching and form one continuous depletion region between junction 26 and 34. This is OFF state for an enhancement-mode JFET. FIG. 4 illustrates schematically the effect of the use of the structure of the invention on the voltage conditions of the gate and well regions. The gate region 20 will have exactly the same bias voltage applied to it as the well region at all times by virtue of the gate region shorting the channel-well junction 26. This short is represented by wire 38.

FIG. 5 is a table which illustrates the various source-to-drain current flow operating conditions and front gate biases that cause them in a three-terminal, enhancement-mode JFET device of the invention. In case 1, the front gate represented by PN junction 34 has zero bias applied to it and the back gate, represented by PN junction 26 also has zero bias voltage applied to it. In this state, because the device is an enhancement-mode JFET, pinchoff conditions exist and there is near zero or zero source-to-drain current flow i.

Case 2 represents the prior art case shown in FIG. 3 where +0.5 volts is applied to the front gate and the back gate is grounded. In this case, source-to-drain current flow is i.

Case 3 is the case according to the teachings of the invention where when +0.5 volts is applied to the front gate, the same bias of +0.5 is automatically applied to the back gate. This case is represented by FIG. 4. This case results in a source-to-drain current flow of 2 times i. The reason the current flow is 2 i in Case 3 is because both the front gate and the back gate are forward biased. This causes the depletion region to pull back or disappear around both of junctions 26 and 34. This effectively doubles the volume in the channel through which current can flow and reduces the resistance proportionately. This increases the current flow to twice the level of the prior art when the back gate is grounded. Of course a current flow of 2 i can be achieved in the prior art structure by using the surface contact of the back gate to forward bias the back gate junction.

The Preferred Epi on Insulator Embodiment Structure and Process

Appendix A is a table giving the process steps to construct the preferred embodiment, the step number and the figure number in which the result of that step is illustrated.

FIG. 6, comprised of FIGS. 6A, 6B, 6C and 6D and shows the results of process steps 1-4 in Appendix A. FIG. 6D is a top view of the active area. FIG. 6A is a sectional view taken along section line AA' in FIG. 6D. FIG. 6B is a sectional view taken along section line BB' in FIG. 6D. FIG. 6C is a sectional view taken along section line CC' in FIG. 6C. FIG. 6 shows the state of construction of the preferred embodiment after: 1) growing a [P−]-doped epitaxial layer 16 of silicon (or other semiconductor) on an insulating substrate 10; defining the active area 12 (typically 40–20 nm) by formation of field oxide 14 in a shallow trench around the active area, referred to as STI by those skilled in the art, preferably by Shallow Trench Isolation; and making an N-channel implant to form channel region 18. The N-channel implant has its energy level(s) set to achieve a depth for the resulting channel-well PN junction 22 of approximately 40 nm. The N-channel implant is done so as to achieve a concentration of approximately $10^{18}$ dopant atoms per cubic centimeter. Implant energy is set to establish the channel-substrate junction 86 at about 40 to 50 NM. Other depths and doping concentrations can be selected so long as they are coordinated with the depth and doping concentration of a gate region to be formed later so as to achieve pinchoff and normally off (enhancement-mode) operation but depletion-mode devices can also be formed by suitably controlling the channel and gate region doping levels and the gate-channel and channel-well junction depths. A typical channel implant is 1E13 dosage at 15 KEV followed by another implant of 4E11 dosage at 37 KEV to achieve optimum doping profile for a normally off N-channel JFET.

The epitaxial layer 16 will become the P-well of the N-channel JFET, and the N-implanted area will form the channel 18 of the N-channel JFET.

The process to grow epitaxial silicon on an insulating substrate is well known.

Shallow Trench Isolation involves etching a trench in the epitaxial silicon around the active area and filling it with CVD silicon dioxide (field oxide) and polishing the resulting structure to planarize it. This allows small active areas to be defined more precisely without the uncertainty of the amount of encroachment into the active area by an oxide "bird's beak" that gets formed when field oxide is grown around the active area as opposed to being deposited in a trench around it.

FIG. 7, comprised of FIGS. 7A, 7B, 7C and 7D, shows the state of the structure after step 5 in the process has been performed to deposit CVD oxide and a layer of nitride and polish it back. FIGS. 7A, 7B, 7C are sectional views of the structure taken along section lines AA', BB' and CC', respectively, in the plan view of FIG. 7D. Step 5 of the process entails formation of a layer of insulating material 42, which is preferably approximately 500 to 1000 angstroms of CVD silicon dioxide (hereafter oxide). After depositing the oxide layer 42, a nitride layer 44 is formed on top of the CVD oxide layer. Nitride layer 44 is approximately 50 angstroms thick.

FIG. 8, comprised of FIGS. 8A, 8B, 8C and 8D, shows the state of the structure after step 6 in the process has been performed to open windows for the gate, source and drain contacts. FIGS. 8A, 8B, 8C are sectional views of the structure taken along section lines AA', BB' and CC', respectively, in the plan view of FIG. 8D. Photoresist is spun on and developed using a mask which defines where the source opening 46, gate opening 48 and drain opening 50 will be formed. Then nitride layer 44 and CVD oxide layer 42 are plasma etched to form source, drain and gate openings down to the active area. These opening define where source, gate and drain contacts will be formed by depositing polysilicon and ion implanting the polysilicon in the source and drain openings with N+ conductivity-enhancing impurities and implanting polysilicon in gate openings with P+ conductivity-enhancing impurities.

The etching of the source, gate and drain openings should stop when the etching process reaches the field oxide outside the active area because it is not desired to short the source-channel or drain-channel junction. Note in FIG. 8D that the source, gate and drain openings 46, 48 and 50 extend out past the perimeter of the active area so as to overlie the field oxide 14. Since the plasma etching process used to etch the source, gate and drain openings is etching through CVD silicon dioxide, there is a danger that it will continue to etch down into the field silicon dioxide. If it etches into the field oxide far enough, it could expose the side walls of the active area deep enough to expose the source-channel or drain-channel junction and lead to an undesired short. The invention only teaches shorting the channel-well junction under the gate region. Therefore, the plasma etch to form the source, gate and drain openings 46, 48 and 50, respectively, should be stopped when it reaches the field oxide. To do this, the capability of the plasma etcher is used to sense when silicon atoms are present in the plasma generated by the etching process. Silicon atoms are in the plasma mix generated by the etching when the etching process completes etching through the CVD oxide and makes contact with the silicon of the active area. Since this process of stopping the etching process is not instantaneous, some overetching can occur. To prevent this overetching from shorting the source-channel or drain-channel PN junction, the source-channel or drain-channel PN junctions are made deeper than usual in prior art JFETs.

FIG. 9, comprised of FIGS. 9A, 9B, 9C and 9D, shows the state of the structure after step 7 in the process has been performed to mask and implant to form a buried gate. FIGS. 9A, 9B, 9C are sectional views of the structure taken along section lines AA', BB' and CC', respectively, in the plan view of FIG. 9D. A layer of photoresist 56 is spun on and developed to protect all areas of the structure from a P+ implant except the area over the gate opening 48. A P+ conductivity-enhancing impurity implant is then performed at an energy level and concentration level sufficient to form a buried gate 54 just below the channel 18. The buried gate 54 is preferred to achieve better control of zero bias pinchoff in enhancement-mode devices, but can be omitted in some embodiments. This P+ buried gate implant can be performed either before or after the channel implant, and is typically boron or BF2 implanted in one or more implants at energy levels from about 50 KEV to 200 KEV so as to deposit most of the P-type impurities below the channel-well junction 26.

FIG. 10, comprised of FIGS. 10A, 10B, 10C and 10D, shows the state of the structure after steps 9 and 10 in the process have been performed to mask and implant to form N+ source and drain regions. FIGS. 10A, 10B, 10C are sectional views of the structure taken along section lines AA', BB' and CC', respectively, in the plan view of FIG. 10D. A layer of photoresist is spun on and masked and developed to expose the source and drain holes 46 and 50 to an N+ conductivity-enhancing implant. Dosage is set to establish N+ conductivity. Preferably, energies are set so that the source and drain regions, 62 and 64, respectively, extend all the way down through the well 16 to the insulator 10. These implantations must be done with sufficient energy levels to establish source-channel and drain-channel junctions which are at least deep enough to avoid shorting when the channel-well junction is intentionally shorted or for source and drain regions to extend all the way to the insulator. This is a precaution to ensure that any accidental overetching of the field oxide in the source and drain regions does not result in shorting out the source-channel or drain-channel junctions. The source and drain regions do not need to extend all the way to the insulator, but they should be deep enough that there is no chance an over etching of the CVD silicon dioxide layer 42 into the field oxide will cause shorting out the source-channel or drain-channel junctions when the source and drain polysilicon contacts are ion implanted to N+ conductivity and annealing drives some of the N-type impurities into the channel region. Multiple implants at different energy levels and short (0.5 to 1 second) annealing steps are used to activate the impurities and get then into the semiconductor lattice in the source and drain regions. Typically, the source and drain implants are done with arsenic using multiple implants at 20 KEV and 100 KEV with a total dose of 1E15. Anneal time is typically 5 seconds at 1000 degrees centigrade.

FIG. 11, comprised of FIGS. 11A, 11B, 11C and 11D, shows the state of the structure after step 11 in the process has been performed to selectively etch the field oxide to expose the side walls of the active area single crystal silicon. FIGS. 11A, 11B, 11C are sectional views of the structure taken along section lines AA', BB' and CC', respectively, in the plan view of FIG. 11D. To reach the state of FIG. 11, the remaining photoresist on the structure is stripped off. Then a known highly selective plasma etching process is used to etch the silicon dioxide field oxide outside the active area through the source, gate and drain contact opening so as to expose the side walls of the active area epitaxially grown single crystal silicon. The depth of this etch is typically about 50 nm and must be enough to expose the channel P-well junction. In the example shown in FIG. 11B, the etch is deep enough to expose not only the channel-well junction 26 but also the junction 27 between the P+ buried gate and the P-well 16. However, the etch only needs to be deep enough to expose the sidewalls (or at least one sidewall) of the channel region at least down to the buried gate 54. The selective etch process recipe was published by A. A. Chambers, in an article entitled "Selectivity/Etch Rate Trade off in Deep and High A/R Oxide Etching" Solid State technology, (February 2005), which is hereby incorporated by reference,. The selective etching leaves trench 66 on both sides of the active area, but a selective etch which exposes only one sidewall of the channel region down to the buried gate or the PN junction between the channel region and the well region will suffice to cause the internal connection between the gate region and the well region so as to eliminate the surface contact to the back gate.

FIG. 12, comprised of FIGS. 12A, 12B, 12C and 12D, shows the state of the structure after step 12 in the process has been performed to deposit undoped polysilicon over the entire structure. FIGS. 12A, 12B, 12C are sectional views of the structure taken along section lines AA', BB' and CC', respectively, in the plan view of FIG. 12D. The trench etched around the active area in the previous step is filled with un-doped polysilicon by chemical vapor deposition or any other suitable process to deposit polysilicon. The polysilicon need only be deposited to a thickness to fill the trench around the active area and fill the contact holes and rise above the nitride layer 44. Typically about 2000 angstroms thickness will be sufficient FIG. 13, comprised of FIGS. 13A, 13B, 13C and 13D, shows the state of the structure after step 13 in the process has been performed to polish off the excess polysilicon and define separate source, drain and gate contacts. FIGS. 13A, 13B, 13C are sectional views of the structure taken along section lines AA', BB' and CC', respectively, in the plan view of FIG. 13D. A chemical-mechanical polishing process is used to polish off the excess polysilicon. Polishing stops at the silicon nitride polish stop layer 44. The removal of the excess polysilicon creates separate source, gate and drain contacts 70, 72 and 74, respectively. An alternative embodiment involves depositing a thick enough polysilicon layer, e.g., 4000 A so that surface is quite level since the polysilicon may level itself during CVD deposition. After the polysilicon deposition, a plasma etch back is used to remove the excess polysilicon down to the nitride layer 44 and thereby define separate source, drain and gate contacts. FIG. 14, comprised of FIGS. 14A, 14B, 14C and 14D, shows the state of the structure after step 14 in the process has been performed to spin on photoresist, mask it and develop it to expose the gate contact polysilicon. FIGS. 14A, 14B, 14C are sectional views of the structure taken along section lines AA', BB' and CC', respectively, in the plan view of FIG. 14D. Photoresist layer 76 is masked and developed to expose the gate polysilicon contact 72 and the polysilicon 68 in FIG. 14B which surrounds the active area 12 and the channel region 18 and the buried gate 54. The exposed polysilicon is then implanted with P-type, conductivity-enhancing impurities. Multiple implants are preferably used with different energy levels to ensure good distribution of impurities throughout the gate polysilicon especially throughout the polysilicon in the regions designated 80 and 82 in FIG. 14B down in the trenches on either side of the active area. Typical implant energies and dosages are BF2 ions implanted in multiple implants at 20 KEV and 40 KEV with a total dose of 5E15. Typically BF2 at 20 KEV and 40 KEV with total dose of 5E15. Dosages are set so as to leave the gate-contact polysilicon doped P+. This sets the stage for the creation of the gate region on the top and side walls of the exposed channel region of the active area. The gate region to be formed in step 16 below will extend down the side walls of the exposed channel area and the buried gate to short the gate area to the well and eliminate the need for the back gate.

Figure 15A:
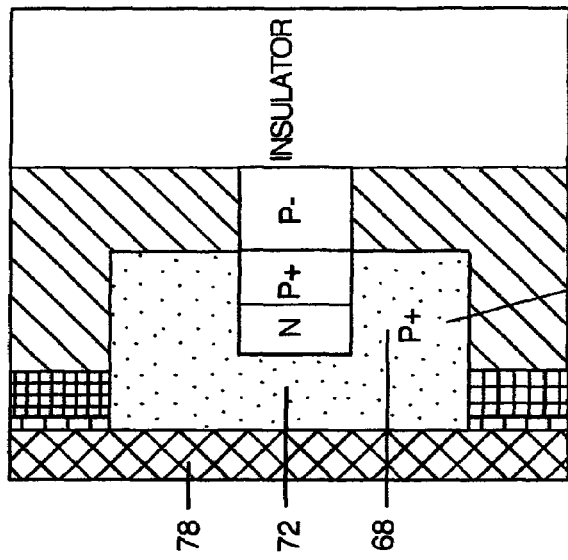
FIG. 15, comprised of FIGS. 15A, 15B, 15C and 15D, shows the state of the structure after step 15 in the process has been performed to dope the source and drain polysilicon contacts N+ and form the source and drain regions.
Figure 15B:
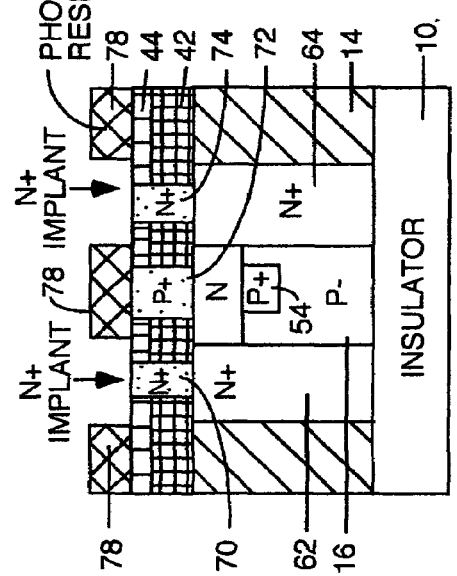
Figure 15C:
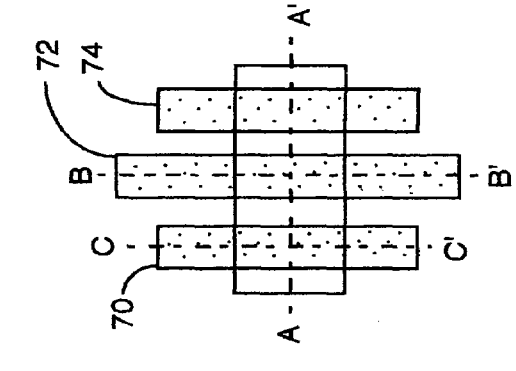
Figure 15D:
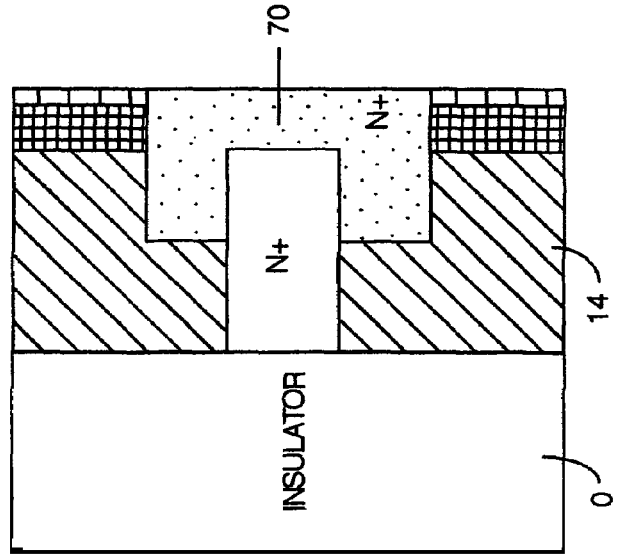

FIG. 15, comprised of FIGS. 15A, 15B, 15C and 15D, shows the state of the structure after step 15 in the process has been performed to dope the source and drain polysilicon contacts N+ and form the source and drain regions. FIGS. 15A, 15B, 15C are sectional views of the structure taken along section lines AA', BB' and CC', respectively, in the plan view of FIG. 15D. First, the old photoresist is stripped off. Then new photoresist is spun on, masked and developed to expose the source and drain polysilicon contacts 70 and 74, respectively. N-type conductivity-enhancing impurities are then ion implanted at concentration levels so as to dope the source and drain polysilicon contacts N+. The ion implantation can be done in multiple implants and at different energy levels to ensure good distribution of the impurities throughout the source and drain contact polysilicon. The result is an N+ doped polysilicon source contact 70 and an N+ doped polysilicon drain contact 72.

FIG. 16, comprised of FIGS. 16A, 16B, 16C and 16D, shows the state of the structure after step 15 in the process has been performed to anneal the N+ and P+-doped polysilicon and form the shallow gate junction and gate region which shorts the channel-well junction. FIGS. 16A, 16B, 16C are sectional views of the structure taken along section lines AA', BB' and CC', respectively, in the plan view of FIG. 16D. After implanting the gate contact polysilicon contact 72 P+ in step 14 and implanting to N+ impurities in the source and drain contact polysilicon contacts 70 and 74, respectively, the impurities must be annealed to get them activated and to form the shallow gate junction and gate region and ohmic contacts for the source and drain.

To form the gate region and shallow gate junction, the structure is annealed at 900 degrees for one second or less to activate the implanted impurities. This annealing step causes the P-type impurities in the gate contact 72 to diffuse down into the active area channel on the top and exposed sidewalls, as shown at 28 in FIG. 16B and FIG. 1. This P+ gate region makes contact with the P+ buried gate 54 and thereby shorts out the channel-well junction 26 (FIG. 1) thereby forming a three terminal device such that when a gate voltage is applied, both the "bottom" and "top" gates (PN junction 34 in FIG. 1 is the "top" gate, and PN junction 26 in FIG. 1 is the bottom gate) modulate the channel transconductance. The top and bottom gates control whether there is current flow between the source and drain terminals by controlling how much of the channel region is within the depletion region surrounding each of these PN junctions 34 and 26. When each of PN junctions 34 and 26 have positive voltages applied in such a manner to move the junction toward being forward biased, the boundaries of the depletions regions around each junction move toward the junction, and this frees more of the channel 18 for conduction. When the top gate has a gate voltage applied which moves junction 34 toward a forward biased state, so does bottom gate 26 move toward a forward biased state. The shrinking depletion regions around both the top and bottom gates open up approximately twice as much of the channel cross-sectional area for current conduction thereby approximately doubling transconductance.

The shorting of the channel-well PN junction 26 by the gate region also renders the surface contact to the well 16 unnecessary. This saves considerable surface area which would otherwise be consumed by the surface contact to the well 16.

The annealing step also causes the N-type conductivity-enhancing impurities from the source and drain contacts to diffuse into the underlying active area source and drain regions to form ohmic contacts of which region 84 is typical. FIG. 16 also represents the state of the structure after silicide 86 is formed on top of each of the N+ and P+ polysilicon lines coupling the source, gate and drain contacts of the JFET device to other nodes in the circuit. In the process of connecting the source, gate and drain of each JFET to another node in the circuit, it sometimes happens that a P+ polysilicon line is coupled to an N+ polysilicon line. This forms an unwanted parasitic device which has diode properties and junction capacitance which can slow the device down. To prevent just parasitic diodes and the associated parasitic capacitances from being formed, silicide is formed on top of each polysilicon line. The silicide is formed in a conventional manner by depositing a layer of titanium, heating it to about 700 degrees C. for a time long enough to cause it react with the underlying polysilicon and form silicide, and then dipping off the remaining titanium.

The final steps are: 1) deposit a thick layer of $SiO_2$ or other suitable dielectric over the entire structure; 2) form contacts openings to the polysilicon lines; 3) deposit metal layer over the entire wafer; 4) etch metal layer to define the interconnects of the circuit. This completes the device.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

APPENDIX A

| FIG. | Step | Process Step |
| --- | --- | --- |
| 6 | 1 | Start with an insulating substrate |
| 6 | 2 | Grow epitaxial silicon on insulator doped P– at 1E15 concentration or doped to a level to achieve 10 to 20 ohm-centimeter resistivity. This will become the P– well 16. |
| 6 | 3 | Define isolated island active area 12 surrounded by field oxide. Preferred method of defining active area is Shallow Trench Isolation. In the claims, the top of the active area will the surface of the wafer farthest from the insulating substrate, or, in the case of a device built on a semiconductor substrate, the wafer surface on the gate region side of the channel-well junction. |
| 6 | 4 | Do an N-channel implant into epitaxial silicon to form channel region with a channel-well PN junction depth of approximately 40-50 nanometers. Multiple implants at 15 KEV 1E13 followed by 37 KEV 4E11 are preferred. |
| 7 | 5 | Deposit 500-1000 angstroms of CVD silicon dioxide (the CVD oxide layer) over the entire structure and form a silicon nitride layer (the nitride layer) of approximately 50 angstroms thickness. The top surface of this layer as referenced in the claims is the surface above the top surface of the active area. |

APPENDIX A-continued

| FIG. | Step | Process Step |
| --- | --- | --- |
| 8 | 6 | Open windows in the CVD oxide and nitride layers using masks for gate, source and drain contacts to develop photoresist and then plasma etching the nitride and CVD oxide layers to form source, gate and drain openings down to the active area. Stop etch as soon as possible after reaching surface of the active area. This is where the polysilicon will be deposited and ion implanted to form source, gate and drain contacts. |
| 9 | 7 | Remove old photoresist, and spin on new photoresist and mask to define area for a P+ buried gate implant. |
| 9 | 8 | Implant P+ to form buried gate and strip resist. Boron or BF2, 1 KEV to 200 KEV (energy set to get most of the impurities just below the channel-well PN junction) |
| 10 | 9 | Remove the old photoresist, and spin on new photoresist and mask and develop to expose source and drain openings to enable source and drain implants. |
| 10 | 10 | Implant N+ conductivity-enhancing impurities to form N+ source and drain regions. Use sufficient energy levels to establish source-channel and drain-channel junctions which are deep enough to avoid shorting when the channel-well junction is intentionally shorted or for source and drain regions to extend all the way to the insulator. |
| 11 | 11 | Form a trench by stripping the remaining photoresist, and selectively plasma etching the silicon dioxide field oxide outside the active area through the source, gate and drain holes to expose the sidewalls of the active area. Use a known highly selective etching process to etch silicon dioxide without etching single-crystal silicon. |
| 12 | 12 | Deposit polysilicon over entire structure so as to fill said trench and said contact openings for said source, gate and drain. |
| 13 | 13 | Use chemical-mechanical polishing process to polish off excess polysilicon down to nitride polish stop layer 44 on top of the silicon dioxide layer 42 on top of the substrate. |
| 14 | 14 | Spin on photoresist and mask and develop to expose area of gate contact where P+ conductivity-enhancing impurities will be implanted to create a P+ gate contact. Implant P+ to dope gate contact and polysilicon surrounding channel sidewalls and buried gate sidewalls P+ |
| 15 | 15 | Strip old photoresist. Spin on new photoresist, mask and develop to expose source and drain polysilicon contacts. Form source and drain contacts by ion implantation of N+ conductivity-enhancing impurities into the source and drain polysilicon contacts. Implant at dosages to leave source and drain polysilicon doped N+. |
| 16 | 16 | Anneal P+ and N+ implanted impurities at 900 degrees for approximately one second or less to form a P+ gate region and shallow gate junction on the top and exposed sidewalls of the active area all the way down to the channel-well junction so as to short the channel-well junction and form a three terminal device. Diffusion of impurities from P+ polysilicon gate contact into channel regions forms a gate-channel junction which is about 10 nm deep in the channel region. N+ impurities from source and drain polysilicon contacts diffuse into the N+ source and drain regions, respectively of the active area to form ohmic contacts. This doubles the transconductance and eliminates the chip area consumed by the back gate surface contact which is no longer needed. |
| 16 | 17 | Form silicide to reduce resistivity of the polysilicon lines connected to the source, gate and drain contacts. The silicide shorts out and PN junction diodes which are formed at the intersection when a P+ polysilicon line is coupled to an N+ polysilicon line. |

APPENDIX A-continued

| FIG. | Step | Process Step |
|---|---|---|
| not shown | 18 | Deposit thick layer of SiO$_2$ or other suitable dielectric over the entire structure and then forming contacts openings to the polysilicon lines. Metal is then deposited over the entire wafer and etched to define the interconnects of the circuit. This completes the device. |

What is claimed is:

1. A junction field-effect transistor, comprising:
an active area comprising a semiconductor material, the active area at least partially surrounded by insulating material;
a well region formed in said active area and doped to a first conductivity type;
a channel region formed in said active area and doped to a second conductivity type and located so as to form a PN junction with said well region;
a trench formed in said insulating material so as to expose at least a portion of a wall of said active area, including at least said PN junction; gate contact polysilicon filling said trench and doped with impurities of said first conductivity type; and
a gate region abutting said channel region and doped with said first conductivity-type type impurities, said gate region in electrical contact with said gate contact polysilicon and extending along said exposed portion of said wall of said active area so as to make electrical contact with said PN junction.

2. The structure of claim 1 further comprising an insulating substrate upon which said single crystal semiconductor of said active area is formed.

3. The structure of claim 1 wherein said active area is formed in a single crystal semiconductor substrate and wherein said well region is formed to have channel-well PN junction at approximately 40 - 50 nanometers from a top surface of said active area.

4. The structure of claim 1 further comprising source and drain regions doped with conductivity-enhancing impurities of a second conductivity type, said source and drain regions formed so as to extend down through said channel region into said well region and to form PN junctions that are far enough away from a surface of said portion of a wall of said active area so as to not be in electrical contact with said gate region.

5. The structure of claim 2 further comprising source and drain regions doped with conductivity-enhancing impurities of a second conductivity type, said source and drain regions formed so as to extend down through said channel region and said well region all the way to said insulating substrate.

6. The structure of claim 1 wherein said trench is formed to expose two walls of said active area far enough down from a top surface of said active area as to expose said PN junction between said channel region and said well region at least two different places on opposite sides of a perimeter of said active area.

7. The structure of claim 5 further comprising:
a first layer of insulating material formed on a top surface of said active area and over said insulating material which defines said active area;
a second layer of insulating material comprising silicon nitride formed over said first layer of insulating material;
openings for source, gate and drain formed in said first and second layers of insulating material over said active area, said opening for said source over said source region, said opening for said drain over said drain region and said opening for said gate over said gate region;
polysilicon doped with impurities of said second conductivity type in said source and drain holes and polished back to be flush with said second layer of insulating material;
and wherein said polysilicon of said gate contact is polished back to be flush with said second layer of insulating material.

8. The structure of claim 7 further comprising a layer of titanium silicide formed on the top of each of said polysilicon source, drain and gate contacts.

9. The structure of claim 8 further comprising a layer of dielectric over the entire structure and having opening formed therein to expose each of said source, drain and gate contacts, and metal interconnect lines making electrical contact with each of said source, drain and gate contacts.

10. A junction field-effect transistor with no back gate surface contact, comprising:
an insulating substrate;
a layer of single crystal semiconductor grown on said insulating substrate and having an active area defined therein by insulating material which at least partially surrounds said active area, semiconductor doped to a first conductivity type;
a well region comprising a portion of said single crystal silicon doped to a first conductivity type;
a channel region adjacent said well region and comprising a portion of said single crystal semiconductor doped to a second conductivity type, said channel and well regions forming a PN junction;
said insulating material which defines said active area having a trench formed therein along at least one of a plurality of sides of said active area so as to expose at least one sidewall of said channel region down at least to said PN junction between said channel and well regions;
an insulating layer on a surface of said active area above said channel region, and having source, drain and gate openings therein at least said gate opening extending beyond a perimeter of said active area;
a gate contact formed of polysilicon within said gate opening and filling said trench, said polysilicon doped to a high concentration with conductivity-enhancing impurities of said first conductivity type;
a gate region doped to said first conductivity type and located under and in electrical contact with said gate contact and extending down said at least one sidewall of said channel region so as to make electrical contact with said well region;
a source contact formed of polysilicon doped to a high concentration with impurities of said second conductivity type and located within said source opening;
a source region under said source contact opening and extending down into said channel and well regions far enough to prevent electrical contact with said gate region;
a drain contact formed of polysilicon doped to a high concentration with impurities of said second conductivity type and located within said drain opening;
a drain region under said drain contact opening and extending down into said channel and well regions far enough to prevent electrical contact with said gate region; and
suicide formed on a surface of each of said source, gate and drain polysilicon contacts to lower the resistance thereof and short out any PN diodes caused by connection of P-doped polysilicon to N-doped polysilicon.

11. The apparatus of claim 10 further comprising a layer of dielectric formed over the entire structure with openings formed therein to make contact with the source, gate and drain contacts and a plurality of metal interconnect lines formed in said openings to connect said contacts with other nodes in a circuit.

12. The apparatus of claim 11 wherein said single crystal silicon is epitaxially grown and wherein said insulating material is Shallow Trench Isolation and wherein said channel region is formed to have channel-well PN junction at approximately 40-50 manometers from a top surface of said active area.

13. The apparatus of claim 11 wherein said active area has four sides and wherein said trench is etched down into said insulating material which defines said active area on two opposite sides of said active area such that said gate region extends down both sides of said active area which have been exposed by said etching step at least to the point where electrical contact with said channel-well PN junction is made.

14. The apparatus of claim 11 further comprising a buried gate within said well region and under said gate contact at said channel-well PN junction and doped to said first conductivity type.

15. A junction field-effect transistor with no back gate surface contact, comprising:
   a semiconductor substrate doped with conductivity-enhancing impurities of a first conductivity type;
   a layer of single crystal semiconductor grown on said insulating substrate and having a rectangular or square active area defined therein by Shallow Trench Isolation which at least partially surrounds said active area, said semiconductor doped to a first conductivity type;
   a well region comprising a portion of said single crystal silicon doped to a first conductivity type;
   a channel region adjacent said well region and comprising a portion of said single crystal semiconductor doped to a second conductivity type, said channel and well regions forming a PN junction which is approximately 40 to 50 nanometers from a top surface of said active area;
   a buried gate within said well region at said channel-well PN junction and doped to said first conductivity type;
   said insulating material which defines said active area having a trench formed therein along two opposite sides of said active area so as to expose at least one sidewall of said channel region down at least to said buried gate or said channel-well PN junction;
   an insulating layer on a surface of said active area above said channel region, and having source, drain and gate openings therein, at least said gate opening extending beyond a perimeter of said active area;
   a gate contact formed of polysilicon within said gate opening and filling said trench, said polysilicon doped to a high concentration with conductivity-enhancing impurities of said first conductivity type;
   a gate region doped to said first conductivity type and located under and in electrical contact with said gate contact and extending down said at least one sidewall of said channel region so as to make electrical contact with said buried gate or said well region;
   a source contact formed of polysilicon doped to a high concentration with impurities of said second conductivity type and located within said source opening;
   a source region under said source contact opening and extending down into said channel and well regions far enough to prevent electrical contact with said gate region;
   a drain contact formed of polysilicon doped to a high concentration with impurities of said second conductivity type and located within said drain opening;
   a drain region under said drain contact opening and extending down into said channel and well regions far enough to prevent electrical contact with said gate region; and
   silicide formed on a surface of each of said source, gate and drain polysilicon contacts to lower the resistance thereof and short out any PN diodes caused by connection of P-doped polysilicon to N-doped polysilicon.

16. A junction field effect transistor, comprising:
   an active area comprising a semiconductor material, the active area at least partially surrounded by insulating material;
   a well region formed in said active area and doped to a first conductivity type;
   a back gate region formed in said well region and doped to the first conductivity type;
   a channel region in said active area doped to a second conductivity type;
   a trench formed in said insulating material so as to expose at least a portion of a wall of said active area, including at least said back gate region;
   gate contact polysilicon filling said trench and doped with impurities of said first conductivity type; and
   a top gate region abutting said channel region and doped with said first conductivity-type impurities, said top gate region in electrical contact with said gate contact polysilicon and extending along said exposed portion of said wall of said active area so as to make electrical contact with said back gate region.

17. The JFET of claim 16, wherein said active area is formed in a semiconductor substrate and wherein said well region is formed to have a channel-well PN junction at approximately 40 - 50 nanometers from a top surface of said active area.

18. The JFET of claim 16, further comprising:
   an insulating substrate upon which the active area is formed;
   source and drain regions doped with impurities of a second conductivity type, said source and drain regions formed so as to extend down through said channel region and said well region all the way to said insulating substrate.

19. The JFET of claim 16, further comprising source and drain regions doped with impurities of a second conductivity type, said source and drain regions formed so as to extend down through said channel region into said well region and to form PN junctions that are far enough away from a surface of said portion of a wall of said active area so as to not be in electrical contact with said top gate region.

20. The JFET of claim 16, wherein said trench is formed to expose two walls of said active area far enough down from a top surface of said active area as to expose said back gate region at least two different places on opposite sides of a perimeter of said active area.

21. The JFET of claim 18, further comprising:
   a first layer of insulating material formed on a top surface of said active area and over said insulating material which defines said active area;
   a second layer of insulating material comprising silicon nitride formed over said first layer of insulating material;
   openings for source, gate and drain formed in said first and second layers of insulating material over said active area, said opening for said source over said source region, said opening for said drain over said drain region and said opening for said gate over said top gate region; and polysilicon doped with impurities of said second conductivity type in said source and drain holes and polished back to be flush with said second layer of insulating material;

wherein said polysilicon of said gate contact is polished back to be flush with said second layer of insulating material.

22. The JFET of claim 21, further comprising a layer of titanium silicide formed on the top of each of said polysilicon source, drain and gate contacts.

23. The JEET of claim 22, further comprising a layer of dielectric over the entire structure and having opening formed therein to expose each of said source, drain and gate contacts, and metal interconnect lines making electrical contact with each of said source, drain and gate contacts.

* * * * *

UNITED STATES PATENT AND TRADEMARK OFFICE
CERTIFICATE OF CORRECTION

PATENT NO. : 7,557,393 B2  Page 1 of 1
APPLICATION NO. : 11/502172
DATED : July 7, 2009
INVENTOR(S) : Madhukar B. Vora It is certified that error appears in the above-identified patent and that said Letters Patent is hereby corrected as shown below:

Col. 18, Ln. 4: After "23. The", delete "JEET" and insert --JFET--.

Signed and Sealed this

Fifth Day of January, 2010

David J. Kappos
*Director of the United States Patent and Trademark Office*